(12) United States Patent
Costanzo et al.

(10) Patent No.: US 11,105,836 B2
(45) Date of Patent: Aug. 31, 2021

(54) INVERTER AND METHOD FOR MEASURING PHASE CURRENTS IN AN ELECTRIC MACHINE

(71) Applicants: STMicroelectronics S.r.l., Agrate Brianza (IT); STMicroelectronics (Shenzhen) R&D Co. Ltd, Shenzhen (CN)

(72) Inventors: Dino Costanzo, Catania (IT); Cheng Pan Cai, Shenzhen (CN); Xi Yu Xu, Shenzhen (CN)

(73) Assignees: STMicroelectronics S.r.l., Agrate Brianza (IT); STMicroelectronics (Shenzhen) R&D Co. Ltd, Shenzhen (CN)

( * ) Notice: Subject to any disclaimer, the term of this patent is extended or adjusted under 35 U.S.C. 154(b) by 8 days.

(21) Appl. No.: 16/746,444

(22) Filed: Jan. 17, 2020

(65) Prior Publication Data
US 2021/0172983 A1 Jun. 10, 2021

(30) Foreign Application Priority Data

Dec. 10, 2019 (CN) .......................... 201911259355.1

(51) Int. Cl.
| | | |
|---|---|---|
| G01R 19/25 | (2006.01) | |
| H02P 27/08 | (2006.01) | |
| H02M 1/00 | (2006.01) | |
| G01R 15/14 | (2006.01) | |
| H02M 7/5387 | (2007.01) | |

(52) U.S. Cl.
CPC .......... *G01R 19/25* (2013.01); *G01R 15/146* (2013.01); *H02M 1/00* (2013.01); *H02M 7/53871* (2013.01); *H02P 27/08* (2013.01); *H02M 2001/0009* (2013.01)

(58) Field of Classification Search
None
See application file for complete search history.

(56) References Cited

U.S. PATENT DOCUMENTS

| | | | | |
|---|---|---|---|---|
| 5,646,619 | A | * 7/1997 | Daubert | .............. H03M 1/1004 341/118 |
| 8,134,327 | B2 | 3/2012 | Forte | |

(Continued)

*Primary Examiner* — Bentsu Ro
(74) *Attorney, Agent, or Firm* — Crowe & Dunlevy

(57) ABSTRACT

A three-phase load is powered by a PWM (e.g., SVPWM) driven DC-AC inverter having a single shunt-topology. A shunt voltage and a branch voltage of the inverter (across a transistor to be calibrated) are measured during a second period of each SVPWM sector, and the drain-to-source resistance of the calibrated transistor is calculated. During the fourth period of each SVPWM sector, the branch voltage is measured again, and another branch voltage across another transistor is measured. Using the drain-to-source resistance of the calibrated transistor and the voltage across the calibrated transistor measured during the fourth period, the phase current through the calibrated transistor is calculated. Using the other branch voltage measured during the fourth period and the drain-to-source resistance of its corresponding transistor (known from a prior SVPWM sector), the phase current through that transistor is calculated. From the two calculated phase currents, the other phase current can be calculated.

13 Claims, 9 Drawing Sheets

(56) References Cited

U.S. PATENT DOCUMENTS

| | | | | |
|---|---|---|---|---|
| 8,982,593 B2* | 3/2015 | Nondahl | ............... | H02M 7/49 |
| | | | | 363/98 |
| 9,660,647 B2* | 5/2017 | Chern | ............... | G11C 7/10 |
| 10,727,853 B1* | 7/2020 | Zhao | ............... | H03M 1/1071 |
| 2003/0234645 A1* | 12/2003 | Iorga | ............... | G01R 35/007 |
| | | | | 324/750.02 |

* cited by examiner

INVERTER AND METHOD FOR MEASURING PHASE CURRENTS IN AN ELECTRIC MACHINE

PRIORITY CLAIM

This application claims the priority benefit of Chinese Application for Patent No. 201911259355.1, filed on Dec. 10, 2019, the content of which is hereby incorporated by reference in its entirety to the maximum extent allowable by law.

TECHNICAL FIELD

This disclosure relates in general to inverters for driving three phase electric machines and, in particular, to a method for distinctly measuring phase currents supplied by the inverter to the electric machine using a single common shunt resistor.

BACKGROUND

The phase windings of a three-phase electric machine may be controlled using pulse width modulated (PWM) signals. To power a three-phase electric machine using a DC power source such as a battery, the PWM control signals are applied to a three-phase inverter which in turn powers the three-phase electric machine. The transistors of the three-phase inverter connect the phase winding taps of the electric machine to either a positive or a negative power supply voltage rail and to ground.

To gain feedback knowledge for use in controlling the electric machine, the current flowing through each phase winding is determined. The phase current measurements are provided to a controller that generates the PWM drive signals that control the transistors of the three-phase inverter. Conventionally, the phase current information can be obtained by sensing the voltage drop on a different resistor in series with each phase winding. In some designs, phase current sensing may be carried out on only two of the three phase windings in view of the fact that the sum of all currents flowing through the phase windings will be zero, and therefore by sensing the current flowing through two of the phases phase windings, the current flowing through the third phase winding can be calculated.

Some techniques have been developed based on the use of a single common shunt resistor connected between the DC power supply and the inverter. Such techniques may involve the measurement of the drain to source voltages of the transistors of the inverters. Depending on the state of the transistors of the inverter, the current of two of the three phase windings may be sensed on the single common shunt resistor.

These techniques of measuring phase currents using a single common shunt resistor have proven to be imprecise because the two sensed currents cannot be simultaneously sensed, and because the measurement of the drain to source voltages of the transistors are affected by the nonlinearity of the transistors. However, for cost savings, the desire for measuring phase currents using a single common shunt resistor remains. Therefore, further development is needed.

SUMMARY

Disclosed herein is an DC-AC inverter system to be coupled to three phase windings of an electric machine. The inverter system includes: a first switching branch coupled between a DC supply voltage node and an intermediate node, the first switching branch having a first terminal to be coupled to a first phase winding of the electric machine; a second switching branch coupled between the DC supply voltage node and the intermediate node, the second switching branch having a second terminal to be coupled to a second phase winding of the electric machine; a third switching branch coupled between the DC supply voltage node and the intermediate node, the third switching branch having a third terminal to be coupled to a third phase winding of the electric machine; a shunt resistor coupled between the intermediate node and ground; and control circuitry.

The control circuitry is configured to apply control signals in accordance with a space vector pulse width modulation (SVPWM) scheme to the first, second, and third switching branches to cause the inverter to drive the first, second, and third phase windings of the electric machine with an three phase AC power signal.

The SVPWM scheme is divided into six sectors, with each sector being divided into a plurality of periods;

The control circuitry is configured to, during at least some sectors of the SVPWM scheme:

during the second period: measure a shunt voltage across the shunt resistor; and measure a drain to source voltage of a first calibration transistor, the first calibration transistor being a transistor of a given switching branch; and during a fourth period: measure the drain to source voltage of the first calibration transistor; and measure a drain to source voltage of a measured transistor, the measured transistor being a transistor of a next switching branch;

determine a drain to source resistance of the first calibration transistor as a function of a resistance of the shunt resistor, the drain to source voltage of the first calibration transistor measured during the second period, and the shunt voltage measured during the second period;

determine a phase current of a given phase winding coupled to the given switching branch as a function of the drain to source voltage of the first calibration transistor measured during the fourth period and the drain to source resistance of the first calibration transistor;

determine a phase current a next phase winding coupled to the next switching branch as a function of the drain to source voltage of the measured transistor measured during the fourth period and a drain to source resistance of the measured transistor known from a prior sector of the SVPWM scheme; and determine a phase current of a remaining phase winding coupled to the remaining switching branch as a function of the phase current of the given phase winding and the phase current of the next phase winding.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
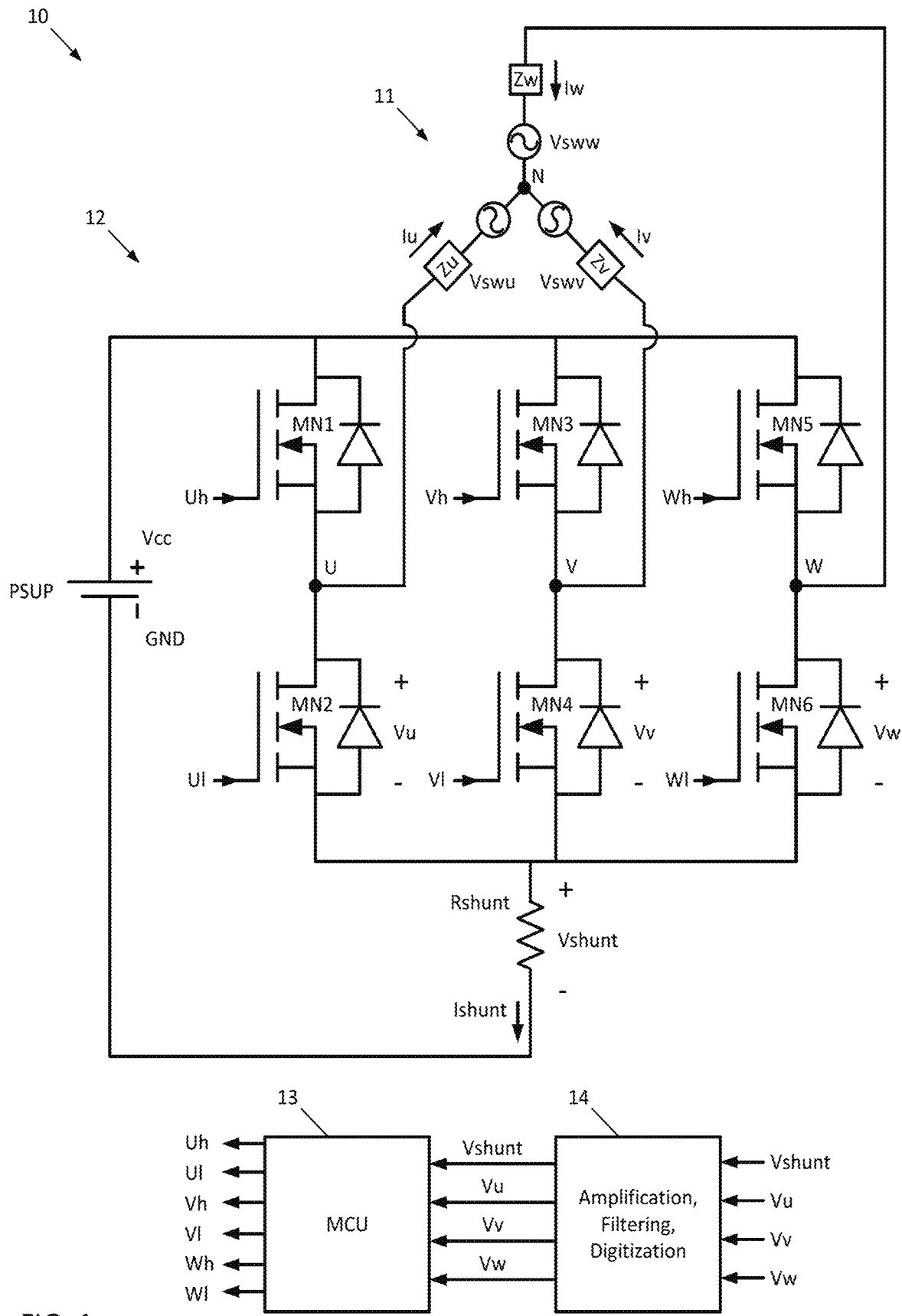
FIG. 1 is a block diagram of a power system which can employ the techniques described herein.

A power system 10 includes a three-phase inverter bridge 12 powering an electric machine 11, as shown in FIG. 1. The three-phase inverter bridge 12 includes six power switches (n-channel transistors) MN1, MN2, MN3, MN4, MN5, and MN6. Although n-channel MOSFETS are shown in FIG. 1, the power system 1 may utilize any suitable power switching devices provided that the voltage drop across the power switching devices is a function of the current flowing through the power switching devices.

In particular, n-channel transistor MN1 has its drain coupled to a supply voltage Vcc, its source coupled to terminal U, and its gate coupled to receive control signal Uh; and n-channel transistor MN2 has its drain coupled to the terminal U, its source coupled to a first terminal of the common shunt resistor Rshunt, and its gate coupled to receive control signal Ul. N-channel transistor MN3 has its drain coupled to the supply voltage Vcc, its source coupled to terminal V, and its gate coupled to receive the control signal Vh; and n-channel transistor MN4 has its drain coupled to the terminal V, its source coupled to the first terminal of the common shunt resistor Rshunt, and its gate coupled to receive the control signal Vl. N-channel transistor MN5 has its drain coupled to the supply voltage Vcc, its source coupled to terminal W, and its gate coupled to receive the control signal Wh; and n-channel transistor MN6 has its drain coupled to the terminal W, its source coupled to the first terminal of the common shunt resistor Rshunt, and its gate coupled to receive the control signal Wl.

Three impedance elements Zu, Zv, and Zw are respectively between the terminals U, V, and W of the three-phase inverter bridge 12 and voltage sources Vswu, Vswv, and Vsww. The voltage sources Vswu, Vswv, and Vsww are coupled to one another at a central node N. The impedance elements Zu, Zv, and Zw and the voltage sources Vswu, Vswv, and Vsww represent an equivalent circuit of three phase windings of an electric machine 11 configured as a Wye connected load driven by the three-phase inverter bridge 12, in which phase currents Iu, Iv, and Iw flow.

A single common current sensing resistor Rshunt is connected between the sources of n-channel transistors MN2, MN4, and MN6 and ground, and therefore functions to sense the DC current Ishunt that is returned to the power supply PSUP.

Phase currents are assumed to be positive when flowing from the terminals U, V, and W to the phase windings, and the DC current Ishunt is assumed to be positive when flowing toward ground.

Complementary pulse width modulation (PWM) signals Uh, Ul, and Vh, Vl, and Wh, Wl control the high side transistor and the low side transistor of each leg of the three-phase bridge 12 (i.e., MN1, MN2, and MN3, MN4, and MN5, MN6, respectively), with dead time insertions to exclude risks of simultaneous turned-on states of the two transistors of a given leg of the three-phase bridge 12 that could result in a potentially damaging short-circuit.

The inductive character of the electric machine 11 load and the consequent phase lag between current and voltage could cause an unrecoverable reduction of the resulting peak-to-peak voltage of the 120° electrically out-phased voltage waveforms that are produced on the phase windings Zu, Zv, Zw when driven by the respective PWM signals Uh, Ul, and Vh, Vl, and Wh, Wl.

The amplification/filtering/digitization block 14 receives as feedback the voltage Vshunt across the resistor Rshunt, the drain to source voltage Vu of MN2, the drain to source voltage Vv of MN4, and the drain to source voltage Vw of MN6, conditions these signals, and passes them in conditioned form to the microcontroller 13. The microcontroller 13 generates the control signals Uh, Ul for MN1-MN2, Vh, Vl for MN3-MN4, and Wh, Wl for MN5-MN6. Note that in some instances, the amplification and/or filtering may be optional.

The method and techniques described herein are for the case of determining the phase currents Iu, Iv, Iw of the electric machine 11 powered by the three-phase bridge 12 controlled by space vector pulse width modulation (SVPWM). However, the disclosed techniques are applicable to any electric machine powered by a three-phase inverter controlled by any PWM scheme.

For each configuration of the low-side transistors MN2, MN4, MN6 of the three legs of the three-phase bridge 12, the current that flows in the shunt resistor Rshunt connected between the sources of MN2, MN4, and MN6 and ground is indicated in Table 1 below.

| Ul (MN2) | Vl (MN4) | Wl (MN6) | Ishunt |
|---|---|---|---|
| 0 (Open) | 0 (Open) | 0 (Open) | 0 |
| 0 (Open) | 1 (Closed) | 1 (Closed) | Iu |
| 0 (Open) | 0 (Open) | 1 (Closed) | −Iw |
| 1 (Closed) | 0 (Open) | 1 (Closed) | Iv |
| 1 (Closed) | 0 (Open) | 0 (Open) | −Iu |
| 1 (Closed) | 1 (Closed) | 0 (Open) | Iw |
| 0 (Open) | 1 (Closed) | 0 (Open) | −Iv |

As understood to those of skill in the art, SVPWM is a modulation scheme used to apply a given voltage vector to an electric machine by switching the transistors MN1-MN6 of the three-phase bridge 12 in the different configurations in the above chart for different periods of time to emulate a three-phase sinusoidal waveform (the "space vector", which is simply the vector sum of the three phase voltages Vu, Vv, Vw produced by the three-phase bridge 12 when modulated according to SVPWM).

Figure 2:
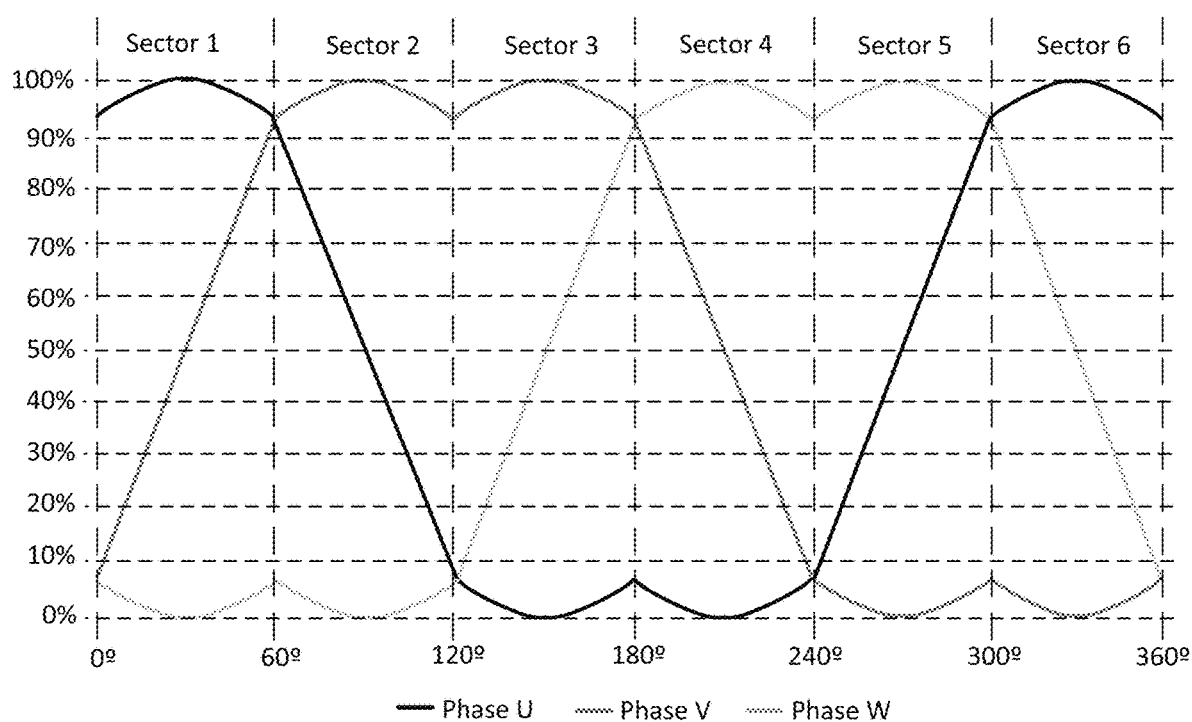
FIG. 2 is a graph of a six sector space vector for use in space vector pulse width modulation (SVPWM).
Figure 3A:
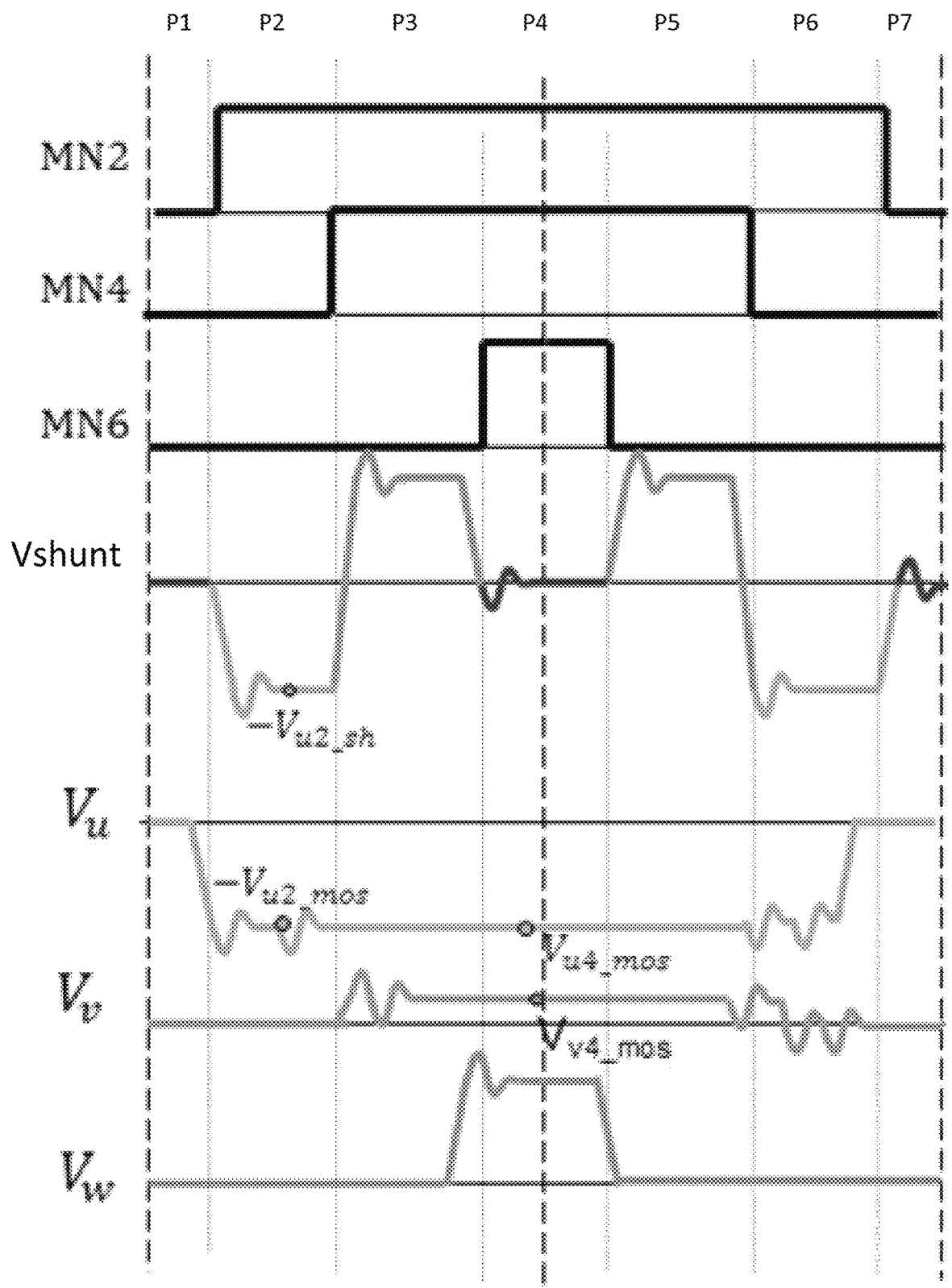
FIGS. 3A-3F are graphs showing operation of the three-phase inverter of the power system of FIG. 1 during the six sectors of SVPWM, and showing sampling points for performing a first phase current determination technique described herein.
Figure 3B:
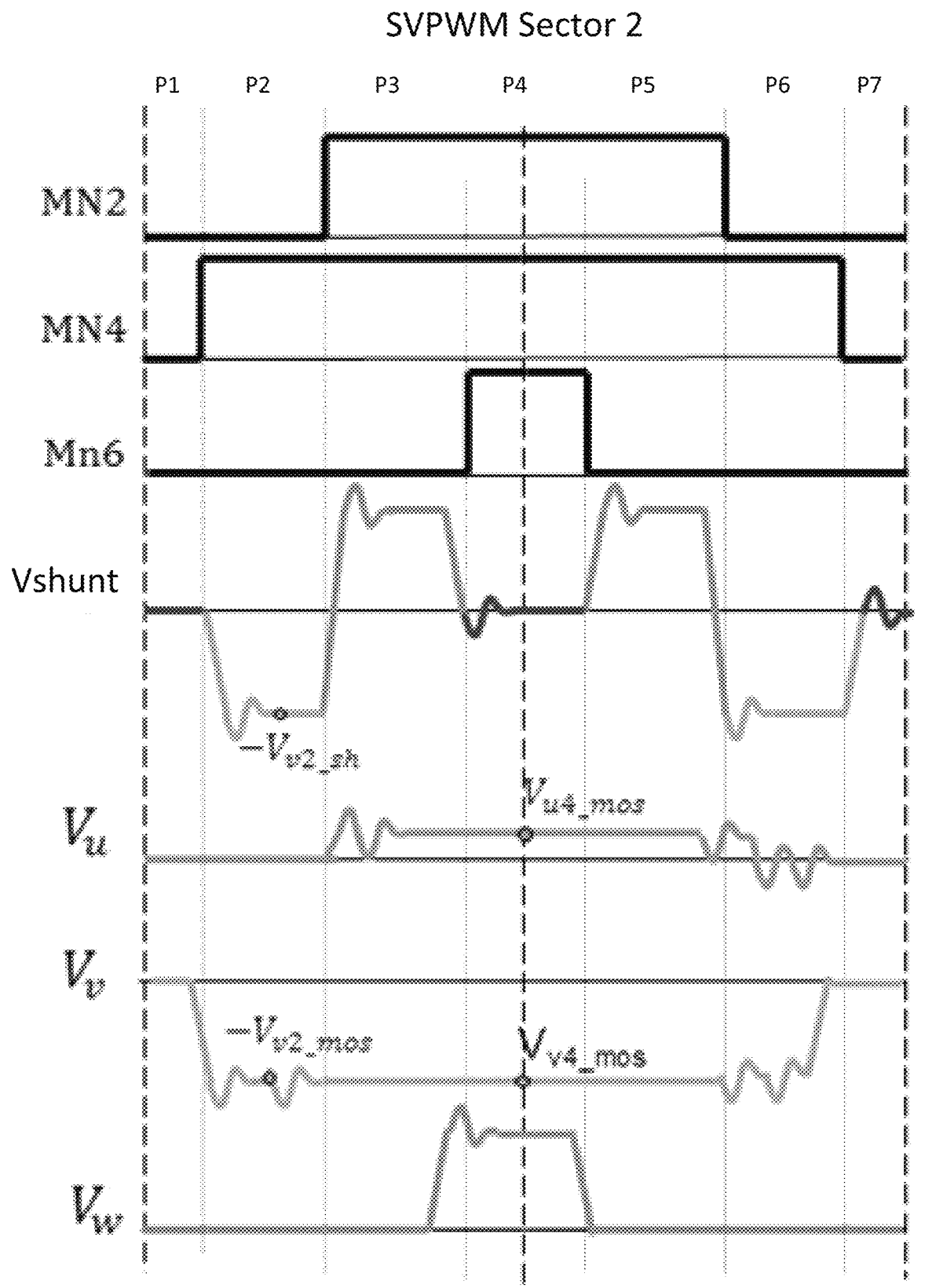
Figure 3C:
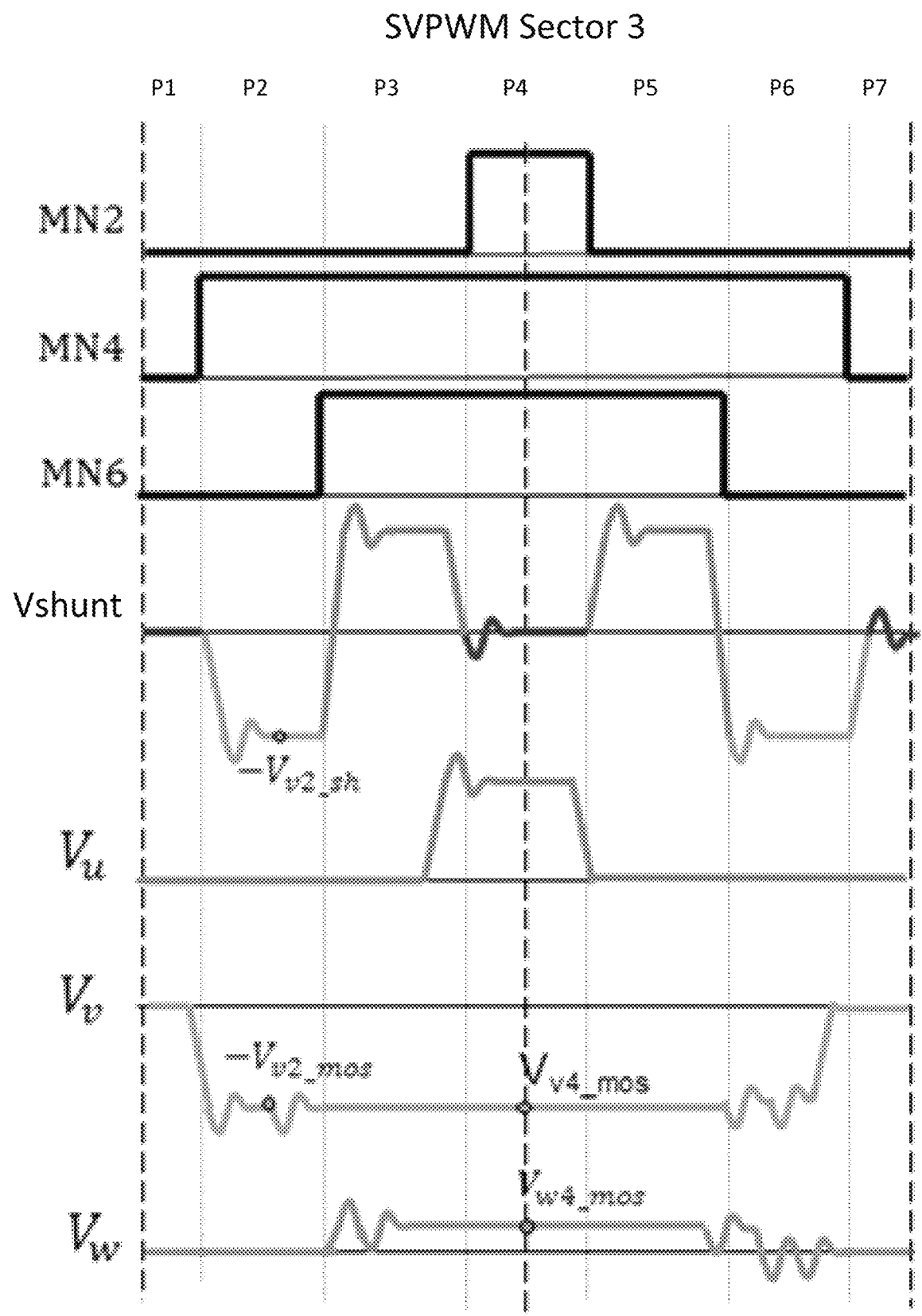
Figure 3D:
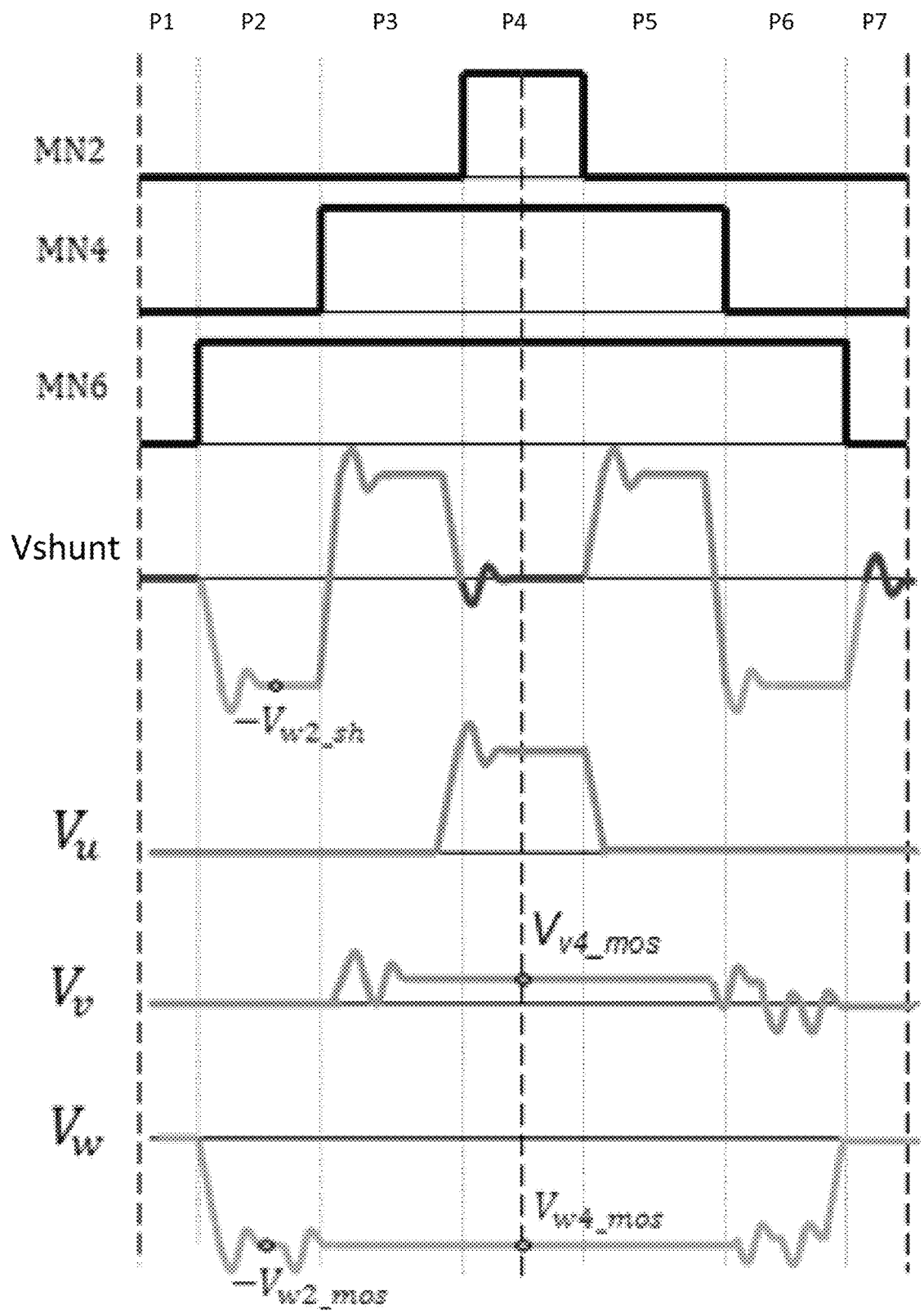
Figure 3E:
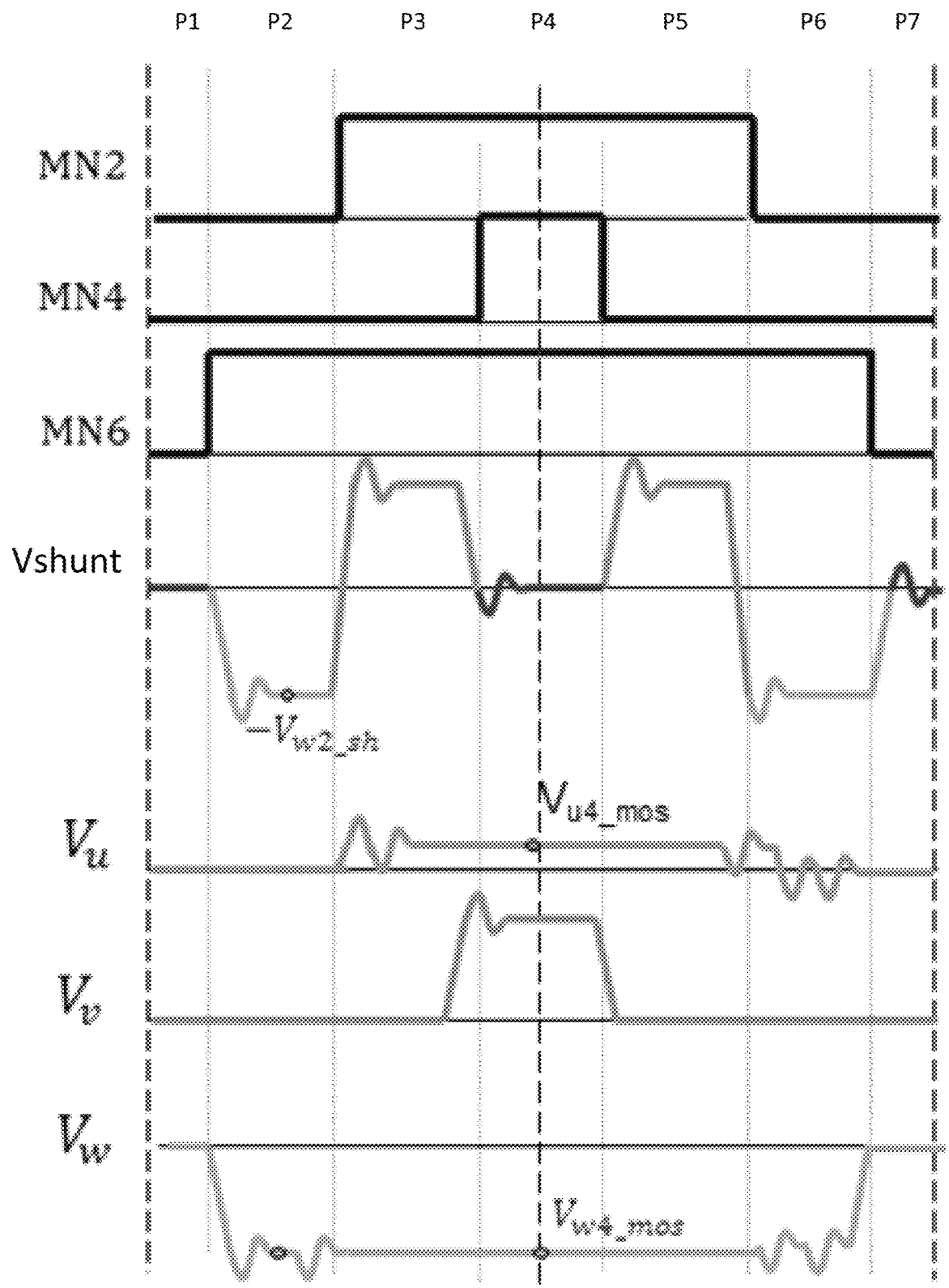
Figure 3F:
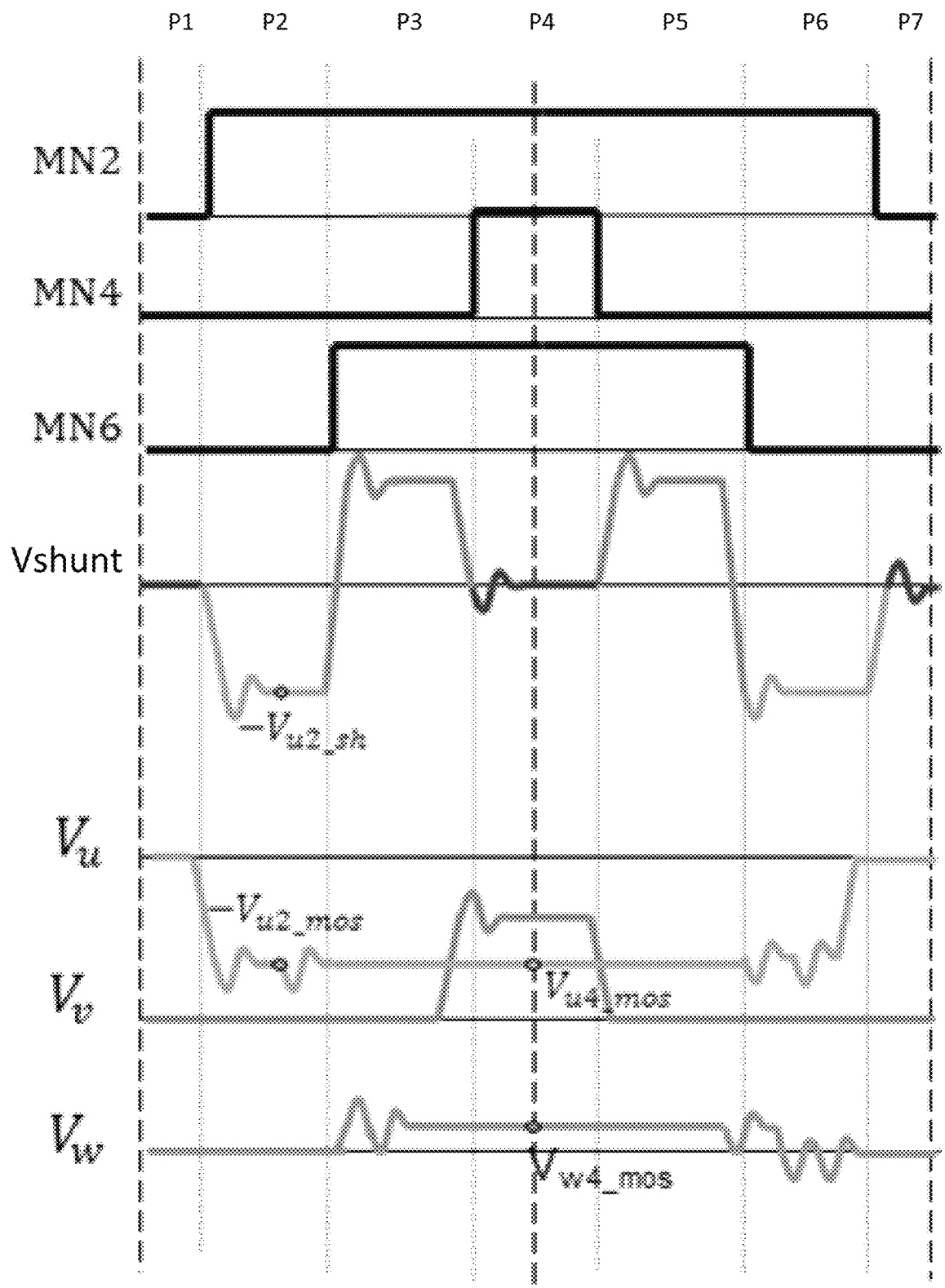

As also understood to those of skill in the art, one full cycle of SVPWM modulation is divided into six "sectors". The space vector used can be seen in graphical form in FIG. 2. As will be seen, each sector contains seven periods.

Described herein are techniques for accurately determining the phase currents Iu, Iv, Iw of the three-phase bridge 12 using the single shunt Rshunt topology three-phase bridge 12. From these determined phase currents (which are used as feedback), the microcontroller 13 may in some cases generation of the control signals Uh, Ul for MN1-MN2, Vh, Vl for MN3-MN4, and Wh, Wl for MN5-MN6 to as to control the electric machine 11 and enhance operation of the electric machine 11.

First Technique (for High Electric Machine Speed)

A first technique will now be described with reference to FIGS. 3A-3F. Note that the technique described with reference to FIGS. 3A-3F is particularly useful for the case where the speed of the electric machine is high. In general, this technique works by measuring Vshunt and one of the voltages Vu, Vv, Vw during the second period of each sector of the SVPWM, and from those two measured voltages calculating the drain to source resistance of the transistor across which the voltage Vu, Vv, or Vw was measured (e.g., MN2, MN4, MN6)—this drain to source resistance can be referred to as the calibrated drain to source resistance (of the sample of that transistor at that instant in time, that takes into accounts the various conditions which may effect the drain to source resistance, such as temperature, gate current, drain current, etc.) for that sector of the SVPWM, and the corresponding transistor can be referred to as the calibrated transistor. Then, during the fourth period of each sector of the SVPWM, the voltage Vu, Vv, or Vw that was measured during the second period is measured again, and one of the other voltages Vu, Vv, or Vv across a corresponding transistor (e.g., MN2, MN4, MN6) is measured. The transistors corresponding to the voltages read during the fourth period of each sector of the SVPWM can be referred to as the read transistors.

Using the calibrated drain to source resistance and the voltage that was measured again during the fourth period of that sector of the SVPWM, the phase current (flowing through the calibrated transistor) is calculated. Then, using the voltage that was measured across the other read transistor during the fourth period, and the drain to source resistance across that read transistor (that was calculated during a prior sector of the SVPWM), the phase current (flowing through that read transistor) is calculated. Finally, since the sum of the phase currents is known to be zero, from the two calculated phase currents for that sector of the SVPWM, the other phase current can be calculated.

Therefore, this first technique can be briefly summed up by the following steps which are performed for each SVPWM sector:

1. Measure Vshunt and a phase voltage (Vu, Vv, or Vw) corresponding to voltage across the transistor to be calibrated, during second period of the SVPWM sector.

2. Calculate the calibrated drain to source resistance RDS of the calibrated transistor (MN2, MN4, or MN6) as:

$$Rds(\text{Calibrated Transistor}) = \frac{Rshunt * Vphase2}{Vshunt2}$$

where "calibrated transistor" is the transistor being calibrated during that sector of the SVPWM, "Rshunt" is the resistance of the resistor Rshunt, "Vshunt2" is the voltage across Rshunt during the second period of that sector of the SVPWM, and "Vphase2" is the voltage across the calibrated transistor during the second period of that sector of the SVPWM.

3. Measure the voltage across the calibrated transistor and a voltage across another of the transistors (MN2, MN4, or MN6), during the fourth period of the SVPWM sector.

4. Calculate the phase current for the calibrated transistor as:

$$I\text{phase(Calibrated Transistor)} = V\text{phase4}/Rds(\text{Calibrated Transistor})$$

where "calibrated transistor" is the transistor that was calibrated during the sector of the SVPWM, and "Vphase4" of the voltage across the calibrated transistor during the fourth period of the sector of the SVPWM.

5. Calculate the phase current for the read transistor (other than the calibrated transistor) across which the voltage was measured during Step 3 as:

$$I\text{phase(Read Transistor)} = V(\text{Read Transistor})/Rds(\text{Read Transistor})$$

where "Read Transistor" is the transistor other than the calibrated transistor across which the voltage was measured during Step 3, where "V(Read Transistor)" is the voltage across the "Read Transistor" as measured during Step 3, and where "Rds(Read Transistor)" is the drain to source resistance of the "Read Transistor" calculated during a previous sector of the SVPWM when that sector was calibrated.

6. Calculate the phase current for the remaining transistor as:

$$I\text{other} = -[I\text{phase(Calibrated Transistor)} + I\text{phase(Read Transistor)}]$$

Note that the values measured during the second period of the SVPWM sectors are to be measured simultaneously, substantially simultaneously, or as close together in time as possible (for example, 1 μs or less; the power the inductance of the electric machine 10 and the higher the DC voltage VCC). This measurement involves the digitization of the measured values by the amplification/filtering/digitization block 14, and these values may be sampled once to produce the digitized versions thereof, or may be sampled multiple times and those samples averaged, filtered, dithered, etc., to produce the digitized versions.

In addition, the values measured during the third period of the SVPWM sectors are to be measured simultaneously, substantially simultaneously, or as close together in time as possible. This measurement involves the digitization of the measured values by the amplification/filtering/digitization block 14, and these values may be sampled once to produce the digitized versions thereof, or may be sampled multiple times and those samples averaged, filtered, dithered, etc., to produce the digitized versions.

The values measured during the fourth period of the SVPWM sectors are to be measured simultaneously, substantially simultaneously, or as close together in time as possible. This measurement involves the digitization of the measured values by the amplification/filtering/digitization block 14, and these values may be sampled once to produce the digitized versions thereof, or may be sampled multiple times and those samples averaged, filtered, dithered, etc., to produce the digitized versions.

Shown below is a chart summarizing which transistor is the calibrated transistor and which transistors are the read transistors, for each sector of the SVPWM when using this first technique.

|  | Sector 1 | Sector 2 | Sector 3 | Sector 4 | Sector 5 | Sector 6 |
|---|---|---|---|---|---|---|
| Calibrated Transistors (during 2nd period) | MN2 | MN4 | MN4 | MN6 | MN6 | MN2 |
| Read Transistors (during 4th period) | MN2, MN4 | MN4, MN2 | MN4, MN6 | MN6, MN4 | MN6, MN2 | MN2, MN6 |

Note that in this chart, the selection of the second transistor to be read during the fourth period (e.g., MN4 in Sector 1, MN2 in Sector 2, MN6 in Sector 3, MN4 in Sector 4, MN2 in Sector 5, and MN6 in Sector 6) is performed considering the two largest duty cycles available in each sector. The other transistor (for example, MN6 in the case of Sector 1) could be chosen, but its duty cycle may not be long enough to complete the sampling of the voltage across that transistor. As such, those of skill in the art should recognize that this chart shows an optimized selection of transistors to be read based upon this target, and that other selections could be possible according to different targets, or if different PWM modulation techniques were used as opposed to SVPWM.

As can be understood from the chart, the oldest calibration drain to source resistance used is three sectors old.

A full cycle of this first technique will now be shown graphically and mathematically with reference to FIGS. 3A-3F.

A. First SVPWM Sector

Turning now to the first SVPWM sector, the phase current determination technique is continued over the seven periods P1-P7. Ul is high (which, as can be seen, causes MN2 to turn on) from the beginning of the second period through to the end of the sixth period, Vl is high (which, as can be seen, causes MN4 to turn on) from the beginning of the third period through the end of the fifth period, and Wl is high (which, as can be seen, causes MN6 to turn on) during the fourth period. Wh, Vh, and Uh are the complements of Wl, Vl, and Ul, and therefore the operation of the transistors MN1, MN3, MN5 is complementary to the operation of transistors MN2, MN4, MN6 described above.

The phase currents Iu, Iv, Iw are calculated during the first SVPWM sector as follows, with it being understood that amplification/filtering/digitization block 14 is digitizing and conditioning Vshunt as well as Vu, Vv, and Vw in the measuring steps described below, and that the microcontroller 13 is in turn generating the control signals Uh, Ul, Vh, Vl, Wh, and Wl.

During the second period, the shunt voltage Vshunt is measured across the shunt resistor Rsh, and here settles at a value of Vu2_sh, and the voltage Vu is measured and settles at −Vu2_mos. From this, the drain to source voltage of MN2 can be calculated as:

$$RdsMN2 = \frac{Rshunt * \text{Vu2\_mos}}{\text{Vu2\_sh}}$$

During the fourth period, the voltages Vu and Vv are measured, and here respectively settle at values of Vu4_mos and Vv4_mos. Now, the phase currents Iu, Iv, and Iw can be calculated. In particular, having the value of RdsMN2, the phase current Iu can be calculated as:

$Iu = Vu4\_mos/RdsMN2$

Having the value RdsMN4 from the prior last time this value was calculated, the phase current Iv can be calculated as:

$Iv = Vv4\_mos/RdsMN4$

Since the sum of the phase currents Iu, Iv, and Iw is zero, Iw can therefore be calculated as:

$Iw = -(Vu4\_mos/RdsMN2 + Vv4\_mos/RdsMN4)$

The values of Vshunt and Vu measured during the second period are to be measured simultaneously, substantially simultaneously, or as close together in time as possible. In addition, this measurement involves the digitization of the analog values of Vshunt and Vu by the amplification/filtering/digitization block 14, and these analog values may be sampled once to produce the digitized versions of Vshunt and Vu, or may be sampled multiple times and those samples averaged to produce the digitized versions of Vshunt and Vu.

Similarly, the values of Vu and Vv measured during the fourth period are to be measured simultaneously, substantially simultaneously, or as close together in time as possible. In addition, this measurement involves the digitization of the analog values of Vu and Vv by the amplification/filtering/digitization block 14, and these analog values may be sampled once to produce the digitized versions of Vu and Vv, or may be sampled multiple times and those samples averaged to produce the digitized versions of Vu and Vv.

B. Second SVPWM Sector

Turning now to the second SVPWM sector, the phase current determination technique is continued over the seven periods P1-P7. As can be seen, Ul is high (causing MN2 to turn on) from the beginning of the third period through to the end of the fifth period, Vl is high (causing MN4 to turn on) from the beginning of the second period through the end of the sixth period, and Wl is high (causing MN6 to turn on) during the fourth period. Wh, Vh, and Uh are the complements of Wl, Vl, and Ul, and therefore the operation of the transistors MN1, MN3, MN5 is complementary to the operation of transistors MN2, MN4, MN6 described above.

The phase currents Iu, Iv, Iw are calculated during the second SVPWM sector as follows, with it being understood that amplification/filtering/digitization block 14 is digitizing and conditioning Vshunt as well as Vu, Vv, and Vw in the measuring steps described below, and that the microcontroller 13 is in turn generating the control signals Uh, Ul, Vh, Vl, Wh, and Wl.

During the second period, the shunt voltage Vshunt is measured across the shunt resistor Rsh, and here settles at a value of Vv2_sh, and the voltage Vv is measured and settles at −Vv2_mos. From this, the drain to source voltage of MN4 can be calculated as:

$$RdsMN4 = \frac{Rshunt * \text{Vv2\_mos}}{\text{Vv2\_sh}}$$

During the fourth period, the voltages Vu and Vv are measured, and here respectively settle at values of Vu4_mos and Vv4_mos. Now, the phase currents Iu, Iv, and Iw can be calculated. In particular, having the value of RdsMN4, the phase current Iv can be calculated as:

$Iv = Vv4\_mos/RdsMN4$

Having the value RdsMN2 from the first sector of the SVPWM, the phase current Iu can be calculated as:

$Iu = Vu4\_mos/RdsMN2$

Since the sum of the phase currents Iu, Iv, and Iw is zero, Iw can therefore be calculated as:

$Iw = -(Vu4\_mos/RdsMN2 + Vv4\_mos/RdsMN4)$

The values of Vshunt and Vv measured during the second period are to be measured simultaneously, substantially simultaneously, or as close together in time as possible. In addition, this measurement involves the digitization of the analog values of Vshunt and Vu by the amplification/filtering/digitization block 14, and these analog values may be sampled once to produce the digitized versions of Vshunt and Vv, or may be sampled multiple times and those samples averaged to produce the digitized versions of Vshunt and Vv.

Similarly, the values of Vu and Vv measured during the fourth period are to be measured simultaneously, substantially simultaneously, or as close together in time as possible. In addition, this measurement involves the digitization of the analog values of Vu and Vv by the amplification/filtering/digitization block 14, and these analog values may be sampled once to produce the digitized versions of Vu and Vv, or may be sampled multiple times and those samples averaged to produce the digitized versions of Vu and Vv.

C. Third SVPWM Sector

Turning now to the third SVPWM sector, the phase current determination technique is continued over the seven periods P1-P7. As can be seen, Ul is high (causing MN2 to turn on) during the fourth period, Vl is high (causing MN4 to turn on) from the beginning of the second period through the end of the sixth period, and Wl is high (causing MN6 to turn on) from the beginning of the third period to the end of the fifth period. Wh, Vh, and Uh are the complements of Wl, Vl, and Ul, and therefore the operation of the transistors MN1, MN3, MN5 is complementary to the operation of transistors MN2, MN4, MN6 described above.

The phase currents Iu, Iv, Iw are calculated during the third SVPWM sector as follows, with it being understood that amplification/filtering/digitization block 14 is digitizing and conditioning Vshunt as well as Vu, Vv, and Vw in the measuring steps described below, and that the microcontroller 13 is in turn generating the control signals Uh, Ul, Vh, Vl, Wh, and Wl.

During the second period, the shunt voltage Vshunt is measured across the shunt resistor Rsh, and here settles at a value of Vv2_sh, and the voltage Vv is measured and settles at −Vv2_mos. From this, the drain to source voltage of MN4 can be calculated as:

$$RdsMN4 = \frac{Rshunt * Vv2\_mos}{Vv2\_sh}$$

During the fourth period, the voltages Vv and Vw are measured, and here respectively settle at values of Vv4_mos and Vw4_mos. Now, the phase currents Iu, Iv, and Iw can be calculated. In particular, having the value of RdsMN4, the phase current Iv can be calculated as:

$$Iv=Vv4\_mos/RdsMN4$$

Having the value RdsMN6 from a prior sector of the SVPWM, the phase current Iw can be calculated as:

$$Iw=Vw4\_mos/RdsMN6$$

Since the sum of the phase currents Iu, Iv, and Iw is zero, Iu can therefore be calculated as:

$$Iu=-(Vv4\_mos/RdsMN4+Vw4\_mos/RdsMN6)$$

The values of Vshunt and Vv measured during the second period are to be measured simultaneously, substantially simultaneously, or as close together in time as possible. In addition, this measurement involves the digitization of the analog values of Vshunt and Vu by the amplification/filtering/digitization block 14, and these analog values may be sampled once to produce the digitized versions of Vshunt and Vv, or may be sampled multiple times and those samples averaged to produce the digitized versions of Vshunt and Vv.

Similarly, the values of Vv and Vw measured during the fourth period are to be measured simultaneously, substantially simultaneously, or as close together in time as possible. In addition, this measurement involves the digitization of the analog values of Vv and Vw by the amplification/filtering/digitization block 14, and these analog values may be sampled once to produce the digitized versions of Vv and Vw, or may be sampled multiple times and those samples averaged to produce the digitized versions of Vv and Vw.

D. Fourth SVPWM Sector

Turning now to the fourth SVPWM sector, the phase current determination technique is continued over the seven periods P1-P7. As can be seen, Ul is high (causing MN2 to turn on) during the fourth period, Vl is high (causing MN4 to turn on) from the beginning of the third period to the end of the fifth period, and Wl is high (causing MN6 to turn on) from the beginning of the second period to the end of the sixth period. Wh, Vh, and Uh are the complements of Wl, Vl, and Ul, and therefore the operation of the transistors MN1, MN3, MN5 is complementary to the operation of transistors MN2, MN4, MN6 described above.

The phase currents Iu, Iv, Iw are calculated during the fourth SVPWM sector as follows, with it being understood that amplification/filtering/digitization block 14 is digitizing and conditioning Vshunt as well as Vu, Vv, and Vw in the measuring steps described below, and that the microcontroller 13 is in turn generating the control signals Uh, Ul, Vh, Vl, Wh, and Wl.

During the second period, the shunt voltage Vshunt is measured across the shunt resistor Rsh, and here settles at a value of Vw2_sh, and the voltage Vw is measured, and here settles at a value of Vw2_mos. From this, the drain to source resistance of MN6 can be calculated as:

$$RdsMN6 = \frac{Rshunt * Vw2\_mos}{Vw2\_sh}$$

During the fourth period, the voltage Vv is measured, and here settles at a value of Vv4_mos, and the voltage Vw is measured, and here settles at a value of Vw4_mos. Now, having the value of RdsMN6, and having the value of RdsMN4 from the prior SVPWM sector, the phase current Iv can be calculated as:

$$Iv=Vv4\_mos/RdsMN4$$

In turn, the phase current Iw can be calculated as:

$$Iw=Vw4\_mos/RdsMN6$$

Since the sum of the phase currents Iu, Iv, and Iw is zero, Iu can therefore be calculated as:

$$Iu=-(Vv4\_mos/RdsMN4+Vw4\_mos/RdsMN6)$$

The values of Vshunt and Vw measured during the second period are to be measured simultaneously, substantially simultaneously, or as close together in time as possible. In addition, this measurement involves the digitization of the analog values of Vshunt and Vw by the amplification/filtering/digitization block 14, and these analog values may be sampled once to produce the digitized versions of Vshunt and Vw, or may be sampled multiple times and those samples averaged to produce the digitized versions of Vshunt and Vw.

The values of Vv and Vw measured during the fourth period are to be measured simultaneously, substantially simultaneously, or as close together in time as possible. In addition, this measurement involves the digitization of the analog values of Vv and Vw by the amplification/filtering/digitization block 14, and these analog values may be sampled once to produce the digitized versions of Vv and Vw, or may be sampled multiple times and those samples averaged to produce the digitized versions of Vv and Vw.

E. Fifth SVPWM Sector

Turning now to the fifth SVPWM sector, the phase current determination technique is continued over the seven periods P1-P7. As can be seen, Ul is high (causing MN2 to turn on) from the beginning of the third period to the end of the fifth period, Vl is high (causing MN4 to turn on) during the fourth period, and Wl is high (causing MN6 to turn on) from the beginning of the second period to the end of the sixth period. Wh, Vh, and Uh are the complements of Wl, Vl, and Ul, and therefore the operation of the transistors MN1, MN3, MN5 is complementary to the operation of transistors MN2, MN4, MN6 described above.

The phase currents Iu, Iv, Iw are calculated during the fifth SVPWM sector as follows, with it being understood that amplification/filtering/digitization block 14 is digitizing and conditioning Vshunt as well as Vu, Vv, and Vw in the measuring steps described below, and that the microcontroller 13 is in turn generating the control signals Uh, Ul, Vh, Vl, Wh, and Wl.

During the second period, the shunt voltage Vshunt is measured across the shunt resistor Rsh, and here settles at a value of Vw2_sh, and the voltage Vw is measured, and here settles at a value of Vw2_mos. From this, the drain to source resistance of MN6 can be calculated as:

$$RdsMN6 = \frac{Rshunt * \text{Vw2\_mos}}{\text{Vw2\_sh}}$$

During the fourth period, the voltage Vu is measured, and here settles at a value of Vu4_mos, and the voltage Vw is measured, and here settles at a value of Vw4_mos. Now, having the value of RdsMN6, and having the value of RdsMN2 from a prior SVPWM sector, the phase current Iv can be calculated as:

$Iu = Vu4\_mos/RdsMN2$

In turn, the phase current Iw can be calculated as:

$Iw = Vw4\_mos/RdsMN6$

Since the sum of the phase currents Iu, Iv, and Iw is zero, Iv can therefore be calculated as:

$Iv = -(Vu4\_mos/RdsMN2 + Vw4\_mos/RdsMN6)$

The values of Vshunt and Vw measured during the second period are to be measured simultaneously, substantially simultaneously, or as close together in time as possible. In addition, this measurement involves the digitization of the analog values of Vshunt and Vw by the amplification/filtering/digitization block 14, and these analog values may be sampled once to produce the digitized versions of Vshunt and Vw, or may be sampled multiple times and those samples averaged to produce the digitized versions of Vshunt and Vw.

The values of Vu and Vw measured during the fourth period are to be measured simultaneously, substantially simultaneously, or as close together in time as possible. In addition, this measurement involves the digitization of the analog values of Vu and Vw by the amplification/filtering/digitization block 14, and these analog values may be sampled once to produce the digitized versions of Vu and Vw, or may be sampled multiple times and those samples averaged to produce the digitized versions of Vu and Vw.

F. Sixth SVPWM Sector

Turning now to the sixth SVPWM sector, the phase current determination technique is continued over the seven periods P1-P7. As can be seen, Ul is high (causing MN2 to turn on) from the beginning of the second period to the end of the sixth period, Vl is high (causing MN4 to turn on) during the fourth period, and Wl is high (causing MN6 to turn on) from the beginning of the third period to the end of the fifth period. Wh, Vh, and Uh are the complements of Wl, Vl, and Ul, and therefore the operation of the transistors MN1, MN3, MN5 is complementary to the operation of transistors MN2, MN4, MN6 described above.

The phase currents Iu, Iv, Iw are calculated during the sixth SVPWM sector as follows, with it being understood that amplification/filtering/digitization block 14 is digitizing and conditioning Vshunt as well as Vu, Vv, and Vw in the measuring steps described below, and that the microcontroller 13 is in turn generating the control signals Uh, Ul, Vh, Vl, Wh, and Wl.

During the second period, the shunt voltage Vshunt is measured across the shunt resistor Rsh, and here settles at a value of Vu2_sh, and the voltage Vu is measured, and here settles at a value of Vu2_mos. From this, the drain to source resistance of MN2 can be calculated as:

$$RdsMN2 = \frac{Rshunt * \text{Vu2\_mos}}{\text{Vu2\_sh}}$$

During the fourth period, the voltage Vu is measured, and here settles at a value of Vu4_mos, and the voltage Vw is measured, and here settles at a value of Vw4_mos. Now, having the value of RdsMN2, and having the value of RdsMN6 from a prior SVPWM sector, the phase current Iu can be calculated as:

$Iu = Vu4\_mos/RdsMN2$

In turn, the phase current Iw can be calculated as:

$Iw = Vw4\_mos/RdsMN6$

Since the sum of the phase currents Iu, Iv, and Iw is zero, Iv can therefore be calculated as:

$Iv = -(Vu4\_mos/RdsMN2 + Vw4\_mos/RdsMN6)$

The values of Vshunt and Vu measured during the second period are to be measured simultaneously, substantially simultaneously, or as close together in time as possible. In addition, this measurement involves the digitization of the analog values of Vshunt and Vu by the amplification/filtering/digitization block 14, and these analog values may be sampled once to produce the digitized versions of Vshunt and Vu, or may be sampled multiple times and those samples averaged to produce the digitized versions of Vshunt and Vu.

The values of Vu and Vw measured during the fourth period are to be measured simultaneously, substantially simultaneously, or as close together in time as possible. In addition, this measurement involves the digitization of the analog values of Vu and Vw by the amplification/filtering/digitization block 14, and these analog values may be sampled once to produce the digitized versions of Vu and Vw, or may be sampled multiple times and those samples averaged to produce the digitized versions of Vu and Vw.

Variant of the First Technique (for Low Electric Machine Speed)

Given the detailed disclosure above of how the first technique works, below is a chart summarizing a variant of the first technique to be used where the electric machine speed is low. Other than the changes in the read transistors for some sectors of the SVPWM, the technique remains the same. Therefore, just the chart for this variant is given, as one of skill in the art will (with the benefit of the above disclosure) well understand how to implement this variant of the first technique.

|  | Sector 1 | Sector 2 | Sector 3 | Sector 4 | Sector 5 | Sector 6 |
|---|---|---|---|---|---|---|
| Calibrated Transistors (during 2nd period) | MN2 | MN4 | MN4 | MN6 | MN6 | MN2 |
| Read Transistors (during 4th period) | MN2, MN6 | MN4, MN2 | MN4, MN2 | MN6, MN4 | MN6, MN4 | MN2, MN6 |

First Technique (Lower Cost Variant)

Given the detailed disclosure above of how the first technique works, below is a chart summarizing a first variant of the first technique in which the voltage of one of the phases is never measured.

|  | Sector 1 | Sector 2 | Sector 3 | Sector 4 | Sector 5 | Sector 6 |
|---|---|---|---|---|---|---|
| Calibrated Transistors (during 2nd period) | MN2 | MN4 | MN4 | No Calibration | No Calibration | MN2 |
| Read Transistors (during 4th period) | MN2, MN4 | MN4, MN2 | MN4, MN2 | MN4 | MN4 | MN2, MN4 |

Second Technique

A second technique will now be described. In general, this technique works by measuring Vshunt and one of the voltages Vu, Vv, Vw during the second period of each sector of the SVPWM, and from those two measured voltages calculating the drain to source resistance of the transistor across which the voltage Vu, Vv, or Vw was measured (e.g., MN2, MN4, MN6)—this drain to source resistance can be referred to as the first calibrated drain to source resistance for that sector of the SVPWM, and the corresponding transistor can be referred to as the first calibrated transistor.

Next, during the third period of each sector of the SVPWM, the technique continues with measuring Vshunt again, the corresponding voltage Vu, Vv, or Vw is measured across the first calibrated transistor, and a voltage Vu, Vv, or Vw is measured across a next transistor to be calibrated, which can be referred to as the second calibrated transistor. From these three measured voltages, the drain to source resistance of the second calibrated transistor can be calculated, and can be referred to as the second calibrated drain to source resistance.

Then, during the fourth period of each sector of the SVPWM, the voltages Vu, Vv, or Vw that were measured during the third period are measured again. The transistors corresponding to the voltages read during the fourth period of each sector of the SVPWM can be referred to as the read transistors.

Using the first calibrated drain to source resistance and the voltage across the first calibrated transistor that was measured again during the fourth period, the phase current flowing through the first calibrated transistor is calculated. Then, using the second calibrated drain to source resistance and the voltage across the second calibrated transistor that was measured again during the fourth period, the phase current flowing through the second calibrated transistor is calculated. Finally, since the sum of the phase currents is known to be zero, from the two calculated phase currents for that sector of the SVPWM, the remaining phase current can be calculated.

Therefore, this second technique can be briefly summed up by the following steps:

1. Measure Vshunt and a phase voltage (Vu, Vv, or Vw) corresponding to voltage across the first transistor to be calibrated, during second period of the SVPWM sector.

2. Calculate the calibrated drain to source resistance RDS of the first calibrated transistor (MN2, MN4, or MN6) as:

$$Rds(\text{First Calibrated Transistor}) = \frac{Rshunt * V1phase2}{Vshunt2}$$

where "first calibrated transistor" is the first transistor being calibrated during that sector of the SVPWM, "Rshunt" is the resistance of the resistor Rshunt, "Vshunt2" is the voltage across Rshunt during the second period of that sector of the SVPWM, and "V1phase2" is the voltage across the first calibrated transistor during the second period of that sector of the SVPWM.

3. Measure Vshunt, a phase voltage (Vu, Vv, or Vw) corresponding to the voltage across the first calibrated transistor, and a phase voltage (Vu, Vv, or Vw) corresponding to a voltage across another of the transistors (MN2, MN4, or MN6) which will become the second calibrated transistor, during the third period of the SVPWM sector.

4. Calculate the calibrated drain to source resistance RDS of the second calibrated transistor (MN2, MN4, or MN6) as:

$$Rds(\text{Second Calibrated Transistor}) = \frac{V2phase3 * Rshunt * Rds(\text{First Calibrated Transistor})}{Vshunt3 * Rds(\text{First Calibrated Transistor}) - V1phase3 * Rshhunt}$$

where "second calibrated transistor" is the second transistor being calibrated during that sector of the VSPWM, "Rshunt" is the resistance of the resistor Rshunt, "Vshunt3" is the voltage across Rshunt during the third period of that sector of the SVPWM, "V1phase3" is the voltage across the first calibrated transistor during the third period of that sector of the SVPWM, and "V2phase3" is the voltage across the second calibrated transistor during the third period of that sector of the SVPWM.

5. Measure the voltages across the first and second calibrated transistors (MN2, MN4, or MN6), during the fourth period of that SVPWM sector.

6. Calculate the phase current for the first calibrated transistor as:

$$I\text{phase(First Calibrated Transistor)} = V1\text{phase4}/Rds(\text{First Calibrated Transistor})$$

where "first calibrated transistor" is the first transistor that was calibrated during that sector of the SVPWM, and "V1phase4" is the voltage across the first calibrated transistor during the fourth period of that sector of the SVPWM.

7. Calculate the phase current for the second calibrated transistor as:

$$I\text{phase(Second Calibrated Transistor)} = V2\text{phase4}/Rds(\text{Second Calibrated Transistor})$$

where "second calibrated transistor" is the second transistor that was calibrated during that sector of the SVPWM, and "V2phase4" is the voltage across the second calibrated transistor during the fourth period of that sector of the SVPWM.

8. Calculate the phase current for the remaining transistor as:

$$Iphase(\text{Remaining Transistor}) = -[Iphase(\text{First Calibrated Transistor}) + Iphase(\text{Second Transistor})]$$

Note that the values measured during the second period of the SVPWM sectors are to be measured simultaneously, substantially simultaneously, or as close together in time as possible. This measurement involves the digitization of the measured values by the amplification/filtering/digitization block 14, and these values may be sampled once to produce the digitized versions thereof, or may be sampled multiple times and those samples averaged to produce the digitized versions.

In addition, the values measured during the third period of the SVPWM sectors are to be measured simultaneously, substantially simultaneously, or as close together in time as possible. This measurement involves the digitization of the measured values by the amplification/filtering/digitization block 14, and these values may be sampled once to produce the digitized versions thereof, or may be sampled multiple times and those samples averaged to produce the digitized versions.

The values measured during the fourth period of the SVPWM sectors are to be measured simultaneously, substantially simultaneously, or as close together in time as possible. This measurement involves the digitization of the measured values by the amplification/filtering/digitization block 14, and these values may be sampled once to produce the digitized versions thereof, or may be sampled multiple times and those samples averaged to produce the digitized versions.

Shown below is a chart summarizing which transistors are the calibrated transistor and which transistors are the read transistors, for each sector of the SVPWM when using this second technique.

|  | Sector 1 | Sector 2 | Sector 3 | Sector 4 | Sector 5 | Sector 6 |
| --- | --- | --- | --- | --- | --- | --- |
| Calibrated Transistors (during 2nd period and 3rd Period) | MN2, MN4 | MN4, MN2 | MN4, MN6 | MN6, MN4 | MN6, MN2 | MN2, MN6 |
| Read Transistors (during 4th period) | MN2, MN4 | MN4, MN2 | MN4, MN6 | MN6, MN4 | MN6, MN2 | MN2, MN6 |

Figure 4:
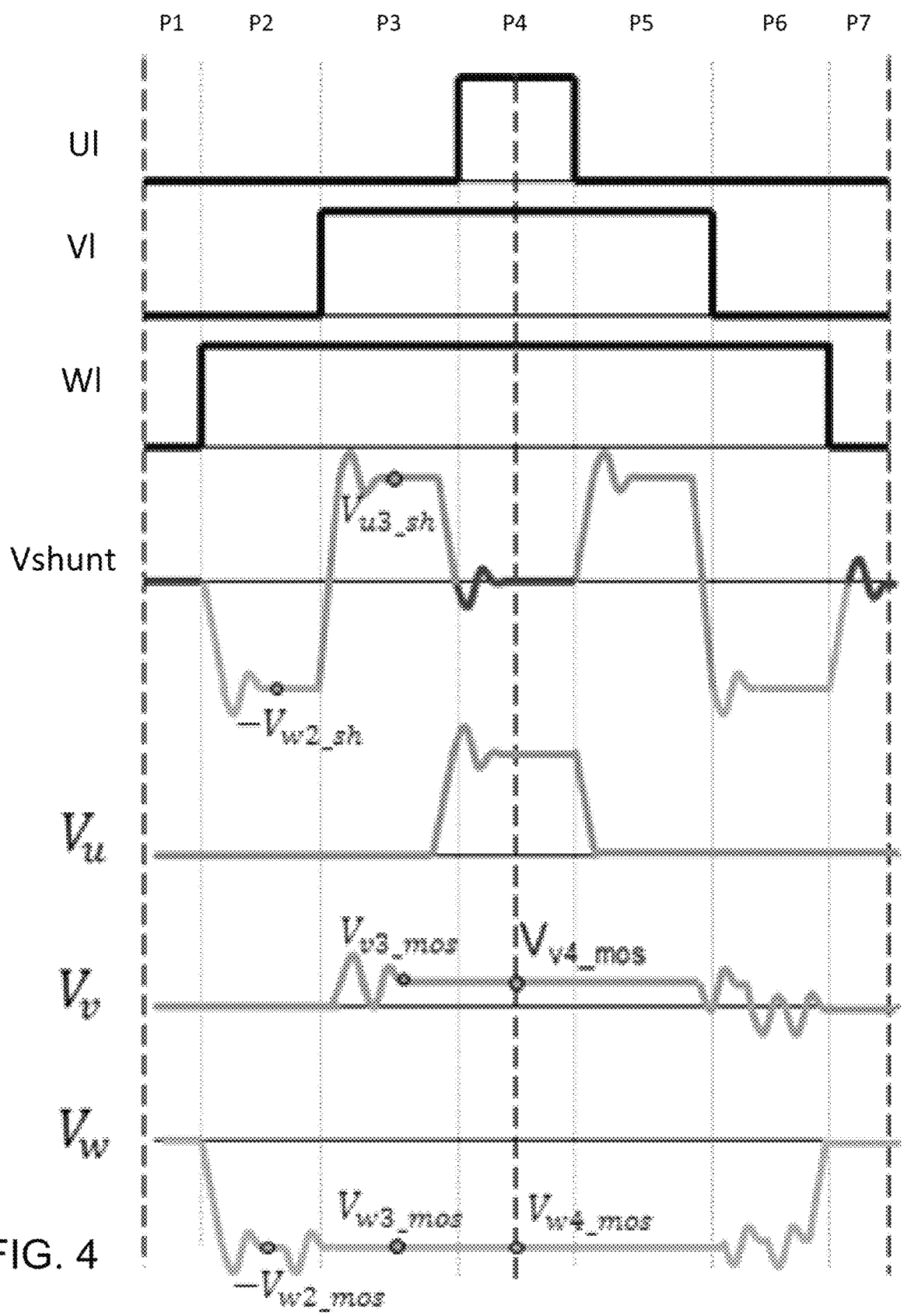
FIG. 4 is a graph showing operation of the three-phase inverter of the power system of FIG. 1 during the fourth sector of SVPWM and showing sampling points for performing a second phase current determination technique described herein.

An example SVPWM sector for this second technique is shown in FIG. 4. Here, the fourth SVPWM is shown, and the phase current determination technique is continued over the seven periods P1-P7. As can be seen, Wl is high (causing MN6 to turn on) from the beginning of the second period to the end of the sixth period, Vl is high (causing MN4 to turn on) from the beginning of the third period to the end of the fifth period, and Wl is high during the fourth period. Wh, Vh, and Uh are the complements of Wl, Vl, and Ul, and therefore the operation of the transistors MN1, MN3, MN5 is complementary to the operation of transistors MN2, MN4, MN6 described above.

The phase currents Iu, Iv, Iw are calculated during the fourth SVPWM sector as follows, with it being understood that amplification/filtering/digitization block 14 is digitizing and conditioning Vshunt as well as Vu, Vv, and Vw in the measuring steps described below, and that the microcontroller 13 is in turn generating the control signals Uh, Ul, Vh, Vl, Wh, and Wl.

During the second period, the shunt voltage Vshunt is measured across the shunt resistor Rsh, and here settles at a value of Vw2_sh, and the voltage Vw is measured, and here settles at a value of Vw2_mos. From this, the drain to source resistance of MN6 can be calculated as:

$$RdsMN6 = \frac{Rshunt * \text{Vw2\_mos}}{\text{Vw2\_sh}}$$

During the third period, the shunt voltage Vshunt is measured, and here settles at a value of Vu3_sh, the voltage Vv is measured, and here settles at a value of Vv3_mos, and the voltage Vw is measured, and here settles at a value of Vw3_mos. From this, the drain to source resistance of MN4 can be calculated as:

$$RdsMN4 = \frac{Vv3_{mos} * Rshunt * RdsMN6}{Vu3_{sh} * RdsMN6 - Vw3_{mos} * Rshunt}$$

During the fourth period, the voltage Vv is measured, and here settles at a value of Vv4_mos, and the voltage Vw is measured, and here settles at a value of Vw4_mos. Now, having the values of RdsMN6 and RdsMN4, the phase current Iv can be calculated as:

$$Iv = Vv4\_mos/RdsMN4$$

In turn, the phase current Iw can be calculated as:

$$Iw = Vw4\_mos/RdsMN6$$

Since the sum of the phase currents Iu, Iv, and Iw is zero, Iu can therefore be calculated as:

$$Iu = -(Vv4\_mos/RdsMN4 = Vw4\_mos/RdsMN6)$$

The values of Vshunt and Vw measured during the second period are to be measured simultaneously, substantially simultaneously, or as close together in time as possible. In addition, this measurement involves the digitization of the analog values of Vshunt and Vw by the amplification/filtering/digitization block 14, and these analog values may be sampled once to produce the digitized versions of Vshunt and Vw, or may be sampled multiple times and those samples averaged to produce the digitized versions of Vshunt and Vw.

Similarly, the values of Vshunt, Vv, and Vw measured during the third period are to be measured simultaneously, substantially simultaneously, or as close together in time as possible. In addition, this measurement involves the digitization of the analog values of Vshunt, Vv, and Vw by the amplification/filtering/digitization block 14, and these analog values may be sampled once to produce the digitized versions of Vshunt, Vv, and Vw, or may be sampled multiple times and those samples averaged to produce the digitized versions of Vshunt, Vv, and Vw.

Likewise, the values of Vv and Vw measured during the fourth period are to be measured simultaneously, substantially simultaneously, or as close together in time as possible. In addition, this measurement involves the digitization of the analog values of Vv and Vw by the amplification/filtering/digitization block 14, and these analog values may be sampled once to produce the digitized versions of Vv and Vw, or may be sampled multiple times and those samples averaged to produce the digitized versions of Vv and Vw.

Second Technique (Lower Cost Variant)

Given the detailed disclosure above of how the second technique works, below is a chart summarizing a first variant of the second technique in which the voltage of one of the phases is never measured, and in which two transistors are not calibrated at every period.

|  | Sector 1 | Sector 2 | Sector 3 | Sector 4 | Sector 5 | Sector 6 |
|---|---|---|---|---|---|---|
| Calibrated Transistors (during 2nd period and 3rd Period) | MN2, MN4 | MN4, MN2 | MN4 |  |  | MN2 |
| Read Transistors (during 4th period) | MN2, MN4 | MN4, MN2 | MN4, MN2 | MN2, MN4 | MN2, MN4 | MN2, MN4 |

General Comments Applicable to First and Second Techniques

Although the techniques described above have been described with respect to the measurement of the voltages across the low side transistors and determination of drain to source resistances of the low side transistors, those of skill in the art will appreciate that the techniques are equally applicable to high side transistors.

As compared to prior art systems utilizing one shunt per phase winding or two shunts per phase winding, the techniques disclosed herein provide for reduced power losses, reduced cost of production, and elimination of asymmetry in the three-phase inverter bridge.

As compared to the prior art systems that also utilize one shunt, the techniques disclosed herein eliminate difficulties encounters when reading voltages in boundary conditions, and provide for simultaneous or substantially simultaneous sampling of two phase voltages (allowing for more accurate results).

In addition, it should be noted that the techniques described above can be applied to other PWM patterns, such as sinusoidal, third harmonic, discontinuous SVPWM, etc. While which measurements are taken during what periods may change, the concept of the transistor calibration described above remains valid.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A DC-AC inverter system to be coupled to three phase windings of an electric machine, the DC-AC inverter system comprising:
   a first switching branch coupled between a DC supply voltage node and an intermediate node, the first switching branch having a first terminal to be coupled to a first phase winding of the electric machine;
   a second switching branch coupled between the DC supply voltage node and the intermediate node, the second switching branch having a second terminal to be coupled to a second phase winding of the electric machine;
   a third switching branch coupled between the DC supply voltage node and the intermediate node, the third switching branch having a third terminal to be coupled to a third phase winding of the electric machine;
   a shunt resistor coupled between the intermediate node and ground; and
   control circuitry configured to apply control signals in accordance with a space vector pulse width modulation (SVPWM) scheme to the first, second, and third switching branches to drive the first, second, and third phase windings of the electric machine with an three phase AC power signal;
   wherein the SVPWM scheme is divided into six sectors, with each sector being divided into a plurality of periods comprising first, second, third, and fourth periods; and
   wherein the control circuitry is configured to, during at least some sectors of the SVPWM scheme:
      during the second period of the plurality of periods:
         measure a shunt voltage across the shunt resistor; and
         measure a drain to source voltage of a first calibration transistor, the first calibration transistor being a transistor of a given switching branch;
      during the fourth period of the plurality of periods:
         measure the drain to source voltage of the first calibration transistor; and
         measure a drain to source voltage of a measured transistor, the measured transistor being a transistor of a next switching branch;
      determine a drain to source resistance of the first calibration transistor as a function of a resistance of the shunt resistor, the drain to source voltage of the first calibration transistor measured during the second period, and the shunt voltage measured during the second period;
      determine a phase current of a given phase winding coupled to the given switching branch as a function of the drain to source voltage of the first calibration transistor measured during the fourth period and the drain to source resistance of the first calibration transistor;
      determine a phase current a next phase winding coupled to the next switching branch as a function of the drain to source voltage of the measured transistor measured during the fourth period and a drain to source resistance of the measured transistor known from a prior sector of the SVPWM scheme; and
      determine a phase current of a remaining phase winding coupled to a remaining switching branch as a function of the phase current of the given phase winding and the phase current of the next phase winding.

2. The DC-AC inverter system of claim 1, wherein the first calibration transistor is a low-side transistor of the given switching branch; and wherein the measure transistor is a low-side transistor of the next switching branch.

3. The DC-AC inverter system of claim 1, wherein the control circuitry determines the drain to source resistance of the first calibration transistor as:

$$Rds(\text{Calibration Transistor}) = \frac{Rshunt * V1phase2}{Vshunt2}$$

where Rshunt is the resistance of the shunt resistor, V1phase2 is the drain to source voltage of the first calibration transistor measured during the second period, and Vshunt2 is the shunt voltage measured during the second period.

4. The DC-AC inverter system of claim 3, wherein the control circuitry determines the phase current of the given phase winding as:

$$Iphase1 = V1phase4/Rds(\text{Calibration Transistor})$$

where V1phase4 is the drain to source voltage of the first calibration transistor measured during the fourth period, and Rds(Calibration Transistor) is the drain to source resistance of the first calibration transistor.

5. The DC-AC inverter system of claim 4, wherein the control circuitry determines the phase current of a next phase winding as:

$$Iphase2 = V2phase4/Rds(\text{Measured Transistor})$$

where V2phase4 is the drain to source voltage of the measured transistor measured during the fourth period, and Rds(Measured Transistor) is the drain to source resistance of the measured transistor known from a prior SVPWM sector.

6. The DC-AC inverter system of claim 5, wherein the control circuitry determines the phase current of the remaining phase winding as:

$$Iphase3 = -(Iphase1 + Iphase2).$$

7. A DC-AC inverter system to be coupled to three phase windings of an electric machine, the DC-AC inverter system comprising:
   a first switching branch coupled between a DC supply voltage node and an intermediate node, the first switching branch having a first terminal to be coupled to a first phase winding of the electric machine;
   a second switching branch coupled between the DC supply voltage node and the intermediate node, the second switching branch having a second terminal to be coupled to a second phase winding of the electric machine;
   a third switching branch coupled between the DC supply voltage node and the intermediate node, the third switching branch having a third terminal to be coupled to a third phase winding of the electric machine;
   a shunt resistor coupled between the intermediate node and ground; and
   control circuitry configured to apply control signals in accordance with a space vector pulse width modulation (SVPWM) scheme to the first, second, and third switching branches to drive the first, second, and third phase windings of the electric machine with an three phase AC power signal;
   wherein the SVPWM scheme is divided into six sectors, with each sector being divided into a plurality of periods comprising first, second, third, and fourth periods; and
   wherein the control circuitry is configured to, during at least some sectors of the SVPWM scheme:
      during the second period of the plurality of periods:
         measure a shunt voltage across the shunt resistor; and
         measure a drain to source voltage of a first calibration transistor, the first calibration transistor being a transistor of a given switching branch;
      during the third period of the plurality of periods:
         measure a shunt voltage across the shunt resistor;
         measure a drain to source voltage of a second calibration transistor, the second calibration transistor being a transistor of a next switching branch; and
         measure the drain to source voltage of the first calibration transistor;
      during the fourth period of the plurality of periods:
         measure the drain to source voltage of the first calibration transistor;
         measure the drain to source voltage of the second calibration transistor; and
         measure a drain to source voltage of a measured transistor, the measured transistor being a transistor of a remaining switching branch;
      determine a drain to source resistance of the first calibration transistor as a function of a resistance of the shunt resistor, the drain to source voltage of the first calibration transistor measured during the second period, and the shunt voltage measured during the second period;
      determine a drain to source resistance of the second calibration transistor as a function of a resistance of the shunt resistor, the drain to source resistance of the first calibration transistor, the drain to source voltage of the first calibration transistor measured during the fourth period, the drain to source voltage of the second calibration transistor measured during the fourth period, and the shunt voltage measured during the fourth period;
      determine a phase current of a given phase winding coupled to the given switching branch as a function of the drain to source voltage of the first calibration transistor measured during the fourth period and the drain to source resistance of the first calibration transistor;
      determine a phase current a next phase winding coupled to the next switching branch as a function of the drain to source voltage of the second calibration transistor measured during the fourth period and the drain to source resistance of the second calibration transistor; and
      determine a phase current of a remaining phase winding coupled to the remaining switching branch as a function of the phase current of the given phase winding and the phase current of the next phase winding.

8. The DC-AC inverter system of claim 7, wherein the first calibration transistor is a low-side transistor of the given switching branch; wherein the second calibration transistor is a low-side transistor of the next switching branch; and wherein the measure transistor is a low-side transistor of the next switching branch.

9. The DC-AC inverter system of claim 7, wherein the control circuitry determines the drain to source resistance of the first calibration transistor as:

$$Rds(\text{First Calibration Transistor}) = \frac{Rshunt * V1phase2}{Vshunt2}$$

where Rshunt is the resistance of the shunt resistor, V1phase2 is the drain to source voltage of the first calibration transistor measured during the second period, and Vshunt2 is the shunt voltage measured during the second period.

10. The DC-AC inverter system of claim 9, wherein the control circuitry determines the phase current of the given phase winding as:

$$I\text{phase1} = V1\text{phase4}/Rds(\text{First Calibration Transistor})$$

where V1phase4 is the drain to source voltage of the first calibration transistor measured during the fourth period, and Rds(First Calibration Transistor) is the drain to source resistance of the first calibration transistor.

11. The DC-AC inverter system of claim 10, wherein the control circuitry determines the drain to source resistance of the second calibration transistor as:

$$Rds(\text{Second Calibrated Transistor}) = \frac{V2\text{phase3} * R\text{shunt} * Rds(\text{First Calibrated Transistor})}{V\text{shunt3} * Rds(\text{First Calibrated Transistor}) - V1\text{phase3} * R\text{shhunt}}$$

where V3phase3 is the drain to source voltage of the second calibrated transistor measured during the third period, V1phase3 is the drain to source voltage of the first calibration transistor measured during the third period, Rshunt is the resistance of the shunt resistor, Vshunt3 is the shunt voltage measured during the third period, and Rds(First Calibration Transistor) is the drain to source resistance of the first calibration transistor.

12. The DC-AC inverter system of claim 11, wherein the control circuitry determines the phase current of a next phase winding as:

$$I\text{phase2} = V2\text{phase4}/Rds(\text{Second Calibration Transistor})$$

where V2phase4 is the drain to source voltage of the second calibration transistor measured during the fourth period, and Rds(Second Calibration Transistor) is the drain to source resistance of the first calibration transistor.

13. The DC-AC inverter system of claim 12, wherein the control circuitry determines the phase current of the remaining phase winding as:

$$I\text{phase3} = -(I\text{phase1} + I\text{phase2}).$$

* * * * *